(12) United States Patent
Harriman (10) Patent No.: US 7,541,792 B2
(45) Date of Patent: Jun. 2, 2009

(54) COMPENSATED SWITCHING POWER SUPPLY CONTROLLER AND METHOD THEREFOR

(75) Inventor: Paul J. Harriman, Goodyear, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 295 days.

(21) Appl. No.: 11/554,681

(22) Filed: Oct. 31, 2006

(65) Prior Publication Data

US 2008/0101775 A1    May 1, 2008

(51) Int. Cl.
 *G05F 1/00* (2006.01)
(52) U.S. Cl. .................. 323/282; 323/242; 323/276; 323/326; 363/50
(58) Field of Classification Search .......... 323/242, 323/271, 282, 276, 326; 363/50
See application file for complete search history.

(56) References Cited

U.S. PATENT DOCUMENTS

| | | | | |
|---|---|---|---|---|
| 5,600,234 A | * | 2/1997 | Hastings et al. | ............. 323/282 |
| 6,121,760 A | * | 9/2000 | Marshall et al. | ............. 323/282 |
| 6,232,755 B1 | * | 5/2001 | Zhang | ............. 323/282 |
| 6,664,774 B2 | * | 12/2003 | Lethellier | ............. 323/282 |
| 7,023,188 B1 | * | 4/2006 | Rice | ............. 323/271 |
| 7,057,381 B2 | | 6/2006 | Harriman et al. | |
| 7,259,603 B2 | * | 8/2007 | Gibson et al. | ............. 327/170 |
| 2004/0257055 A1 | * | 12/2004 | Aioanei | ............. 323/282 |
| 2005/0237040 A1 | * | 10/2005 | Rice | ............. 323/282 |
| 2006/0049815 A1 | * | 3/2006 | Ho et al. | ............. 323/282 |
| 2006/0113974 A1 | * | 6/2006 | Kan et al. | ............. 323/282 |
| 2006/0125454 A1 | * | 6/2006 | Chen et al. | ............. 323/282 |
| 2007/0170902 A1 | * | 7/2007 | Chen et al. | ............. 323/282 |

* cited by examiner

*Primary Examiner*—Akm E Ullah
*Assistant Examiner*—Arun Williams
(74) *Attorney, Agent, or Firm*—Robert F. Hightower (57) ABSTRACT

In one embodiment, a multi-channel power supply controller adjusts the value of an error signal to minimize overshoot and undershoot during load transients.

20 Claims, 5 Drawing Sheets

COMPENSATED SWITCHING POWER SUPPLY CONTROLLER AND METHOD THEREFOR

BACKGROUND OF THE INVENTION

The present invention relates, in general, to electronics, and more particularly, to methods of forming semiconductor devices and structure.

In the past, and the semiconductor industry utilized various methods and structures to form switching power supply controllers that would regulate a power supply voltage to a desired voltage value. These power supply controllers were used to provide regulated power supply voltages for various applications including power supplies for microprocessors systems and computer systems. In these applications, it was important to maintain regulation when the value of the load current required by the load that used the power supply voltage changed. For example, the load may require an increase in load current in order for the load to perform a particular task or the load may have a decrease in load current after a particular task was completed. Often, these load current changes or transients caused the value of the output voltage to either overshoot the desired maximum value or undershoot the desired minimum value. These overshoots and undershoots negatively affected the operation of the system used the power supply voltage.

Accordingly, it is desirable to have a power supply controller that minimizes the change in the value of the output voltage for a change in the amount of current required by a load.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
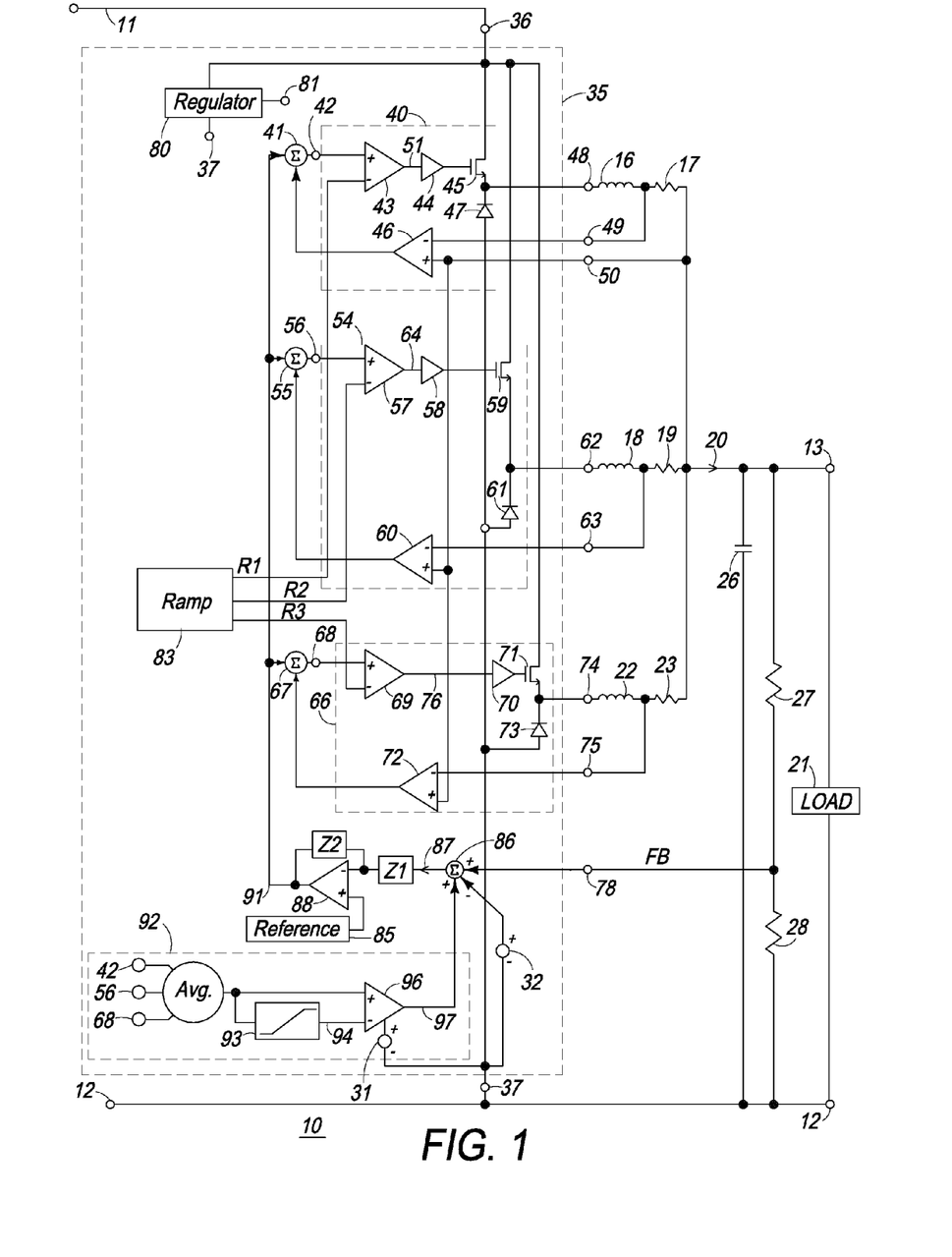
FIG. 1 schematically illustrates an embodiment of a portion of a multi-channel power supply system that includes a multi-channel power supply controller in accordance with the present invention.

FIG. 1 schematically illustrates a portion of an embodiment of a multi-channel power supply system 10 that includes an exemplary form of a multi-channel power supply controller 35. System 10 receives power between a voltage input terminal 11 and a voltage return terminal 12 and provides a regulated output voltage between an output 13 and terminal 12. A load 21 typically is connected between output 13 and terminal 12 to receive the output voltage formed on output 13 and to receive a load current 20. Multi-channel power supply controller 35 compensates an error signal of controller 35 in order to minimize overshoot and undershoot of the output voltage such as those that may result from changes in the amount of current required by load 21.

System 10 includes a plurality of output channels that each provides an output current that is summed together on output 13 to provide the output voltage and load current 20. The first output channel of the plurality of output channels includes an inductor 16 and a current sense resistor 17, a second output channel of the plurality of output channels includes an inductor 18 and a current sense resistor 19, and a third output channel of the plurality of output channels includes an inductor 22 and a current sense resistor 23. A storage capacitor 26 generally is connected between output 13 and terminal 12. A feedback network may be connected between output 13 and terminal 12 in order to provide a feedback (FB) signal at a FB node between resistors 27 and 28 that is representative of the output voltage.

Controller 35 receives power between a voltage input 36 and a voltage return 37. Controller 35 includes a plurality of switching channels, such as switching channels or switching circuits 40, 54, and 66, so that there is approximately one switching channel for each channel of system 10. Although controller 35 is illustrated to have three switching control channels, controller 35 and system 10 may have more or fewer than three channels. Controller 35 also usually includes a ramp generator or ramp 83, a compensation control circuit or compensation controller 92, a summing circuit 86, and an error signal generator circuit or error signal generator that includes an error amplifier 88 and summing circuits 41, 55, and 67. Error amplifier 88 generally is an operational amplifier that includes impedances, such as an input impedance Z1 and a feedback impedance Z2, that are used to control the gain of amplifier 88 and provide frequency compensation for the control loop that includes amplifier 88. A reference circuit or reference 85 generally is utilized to provide a reference voltage for use by amplifier 88. Controller 35 also typically includes an internal regulator 80 that receives the voltage from input 36 and provides an internal operating voltage on an output 81 that is used for operating elements of controller 35 such as ramp 83, amplifier 88, and controller 92. Switching control circuit 40 generally includes a ramp comparator 43, a power switch such as a power transistor 45, a power switch driver 44, a synchronous rectifier diode 47, and a current sense amplifier 46. Similarly, switching control circuit 54 includes a ramp comparator 57, a power switch such as a power transistor 59, a switch driver 58, a synchronous rectifier diode 61, and a current sense amplifier 60, and a third switching control circuit 66 includes a ramp comparator 69, a power switch such as a power transistor 71, a switch driver 70, a synchronous rectifier diode 73, and a current sense amplifier 72. Those skilled in the art will appreciate that diodes 47, 61, and 73 may be replaced by transistors that are controlled to function as synchronous rectifiers.

Ramp 83 typically provides three free running ramp signals (R1, R2, and R3) so that each switching control channel of controller 35 receives a ramp signal. Ramp 83 is configured to form the ramp signals to operate at different phase angles but substantially equal amplitudes so that the three channels of controller 35 also operate substantially at these different phase angles. Ramp 83 typically includes an oscillator and various logic circuitry to provide the phase separation between the ramp signals. Such multi-phase ramp signals are well-known to those skilled in the art. One example of multi-phase ramp signals is disclosed in U.S. Pat. No. 7,023,188 that issued to Benjamin Rice on Apr. 4, 2006 and that is hereby incorporated herein by reference.

Each switching control circuit, such as circuits 40, 54, and 66, receives the respective ramp signal and an error signal from the respective summing circuit and forms a switching control signal on the output of the respective comparator that is utilized to drive the respective power switch to regulate the value of the output voltage. For example, circuit 40 receives ramp signal R1 and the error signal from summing circuit 41. If the value of the error signal is greater than the value of R1, a switching control signal 51 on the output of comparator 43 is high which enables transistor 45 to supply an output current through an output 48 to form load current 20. As the output current flows through resistor 17, a current feedback signal (CS1) is formed across resistor 17 which is received by amplifier 46 between current sense inputs 49 and 50. Controller 35 receives the feedback (FB) signal through a feedback input 78 and the error signal generator of amplifier 88 forms a compensated deviation signal on an output 91 that represents the deviation of the output voltage from a desired value of the output voltage. Summing circuit 41 sums together the compensated deviation signal from output 91 and the current sense signal for channel 40 and forms the error signal on an error node 42.

Similarly, summing circuit 55 receives the compensated deviation signal from output 91 in addition to the current sense signal for channel 54 from amplifier 60 and sums the compensated deviation signal and the current sense signal together to form a second error signal on an error node 56. Comparator 57 receives the second error signal and ramp R2 and responsively forms a switching control signal 64 that is utilized to control transistor 59 to supply an output current to output 62. The output current flows through inductor 18 and sense resistor 19 to assist in forming current 20. Amplifier 60 receives the current sense signal between inputs 63 and 50 and forms the current sense signal that is summed with the compensated deviation signal. In a similar manner, summing circuit 67 receives the compensated deviation signal from output 91 and the current sense signal from amplifier 72 and forms a third error signal on an error node 68. Comparator 69 receives the third error signal and ramp R3 and responsively forms a third switching control signal 76 that is utilized to control transistor 71 to supply an output current through an output 74. The output current from transistor 71 flows through output 74, inductor 22, and resistor 23 to assist in forming current 20. Amplifier 72 receives the current sense signal between inputs 75 and 50 and responsively forms the third current sense signal that is received by circuit 67. Those skilled in the art will appreciate that the current sense signals usually are used to balance load current 20 among each channel so that the output currents of circuits 40, 54, and 66 are close to the same values. In some embodiments, the current sense signal may not be used and the compensated deviation signal from amplifier 88 could become the error signal used for each channel.

Figure 2:
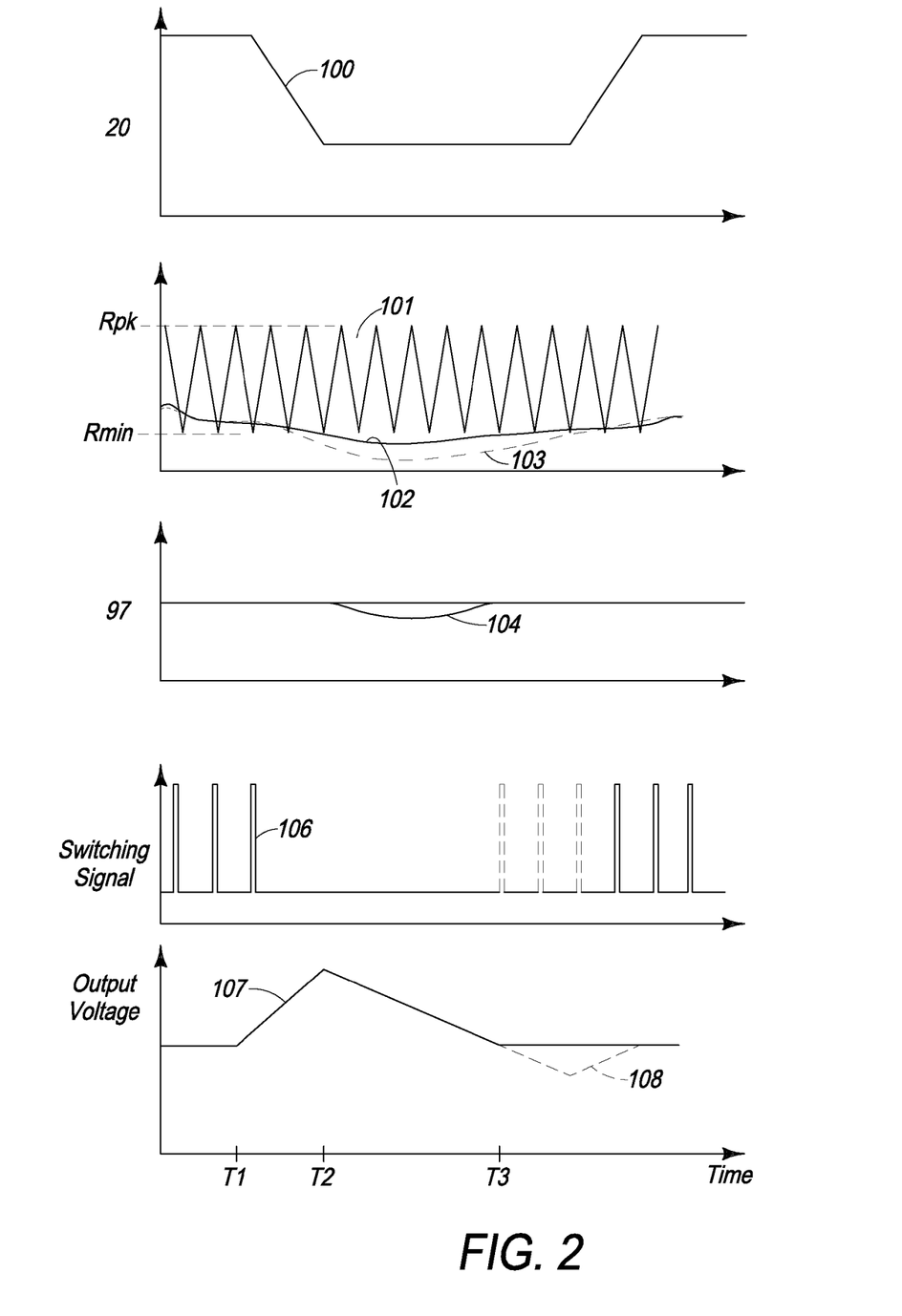
FIG. 2 is a graph having plots that illustrate some of the signals of the multi-channel power supply controller of FIG. 1 accordance with the present invention.

FIG. 2 is a graph having plots that illustrate various signals during the operation of controller 35. The abscissa indicates time and the ordinate illustrates increasing values of the illustrated signal. A plot 100 illustrates relative values of load current 20. A plot 101 illustrates one of the ramp signals, such as R1, from ramp 83. A plot 102 illustrates the error signal for the switching control circuit corresponding to the ramp signal of plot 101, such as circuit 40. A plot 104 illustrates a compensation signal 97 formed on an output of controller 92. A plot 106 illustrates the switching control signal from the same switching control circuit, such as switching control signal 51. A plot 107 illustrates the output voltage between output 13 and terminal 12 and a plot 108 illustrated the output voltage without controller 92. This description has references to FIG. 1 and FIG. 2.

Compensation control circuit or compensation controller 92 forms compensation signal 97 that is used to adjust the value of the error signal in order to minimize overshoot and undershoot of the output voltage. Compensation controller 92 receives the error signals from each channel, such as from error nodes 42, 56, and 68, and averages the error signals together to form an averaged error signal. A compensation generator 93 receives the averaged error signal and forms a compensation control signal 94 that is substantially equal to the value of the averaged error signal as long as the value of the averaged error signal is no greater than a peak value (Rpk) of the ramp signal and as long as the averaged error signal is no less than a minimum value (Rmin) of the ramp signal. If the value of the averaged error signal is equal to or greater than Rpk, generator 93 is configured to form signal 94 to be substantially equal to Rpk and if the averaged error signal is equal to or less than Rmin, generator 93 is configured to form signal 94 to be substantially equal to Rmin. In some embodiments, generator 93 may also receive a reference ramp signal from ramp 83 in order to assist setting the Rpk and Rmin limits. Compensation control signal 94 is subtracted from the averaged error signal to form compensation signal 97. A compensation amplifier 96 receives the averaged error signal and compensation control signal 94 and forms compensation signal 97. Preferably, compensation signal 97 is substantially equal to substantially zero for values of the averaged error signal that are no greater than Rpk and no less than Rmin. In the embodiment illustrated in FIG. 1, in order to form signal 97 so that decreases in the error signal may reduce the value of signal 87, amplifier 96 is formed to provide an offset voltage, illustrated by an offset 31, and the output of amplifier 96 varies around the offset voltage. This is illustrated by plot 104. The straight line in plot 104 represents the offset voltage from the output of amplifier 96 and the negative excursion of plot 104 represents the amount that the averaged error signal is less than Rmin. This constant value of offset 31 is a portion of signal 97 for the embodiments illustrated in FIG. 1. Thus, if the value of the averaged error signal is greater than Rpk, compensation signal 97 is substantially equal to the difference between the averaged error signal and Rpk plus the constant value of offset 31. Also, if the averaged error signal is less than Rmin, amplifier 96 forms compensation signal 97 to be substantially equal to the difference between the averaged error signal and Rmin plus the constant value of offset 31. Thus, it can be seen that the excursions of compensation signal 97 represents the amount that the averaged error signal either exceeds Rpk or is less than Rmin. For the exemplary embodiment illustrated in FIG. 1, compensation signal 97 varies around the value of offset 31 with the variations in the error signal. For example, if the error signal increases past Rpk, signal 97 also increases. These variations or deviations of signal 97 represent the respective amount of the overshoot or undershoot that occurs in the control loops based on the changes in the value of the output voltage. Note that the value of offset 31 is cancelled out in signal 87 by the value of offset 32. In other embodiments, the output of amplifier 96 may directly represent the excursions and the output of amplifier 96 may not swing around a constant value such as the value of offset 31.

Summing circuit 86 adds these deviations of signal 97 from the signal that is received by the error signal generator in order to reduce the amount of overshoot or undershoot. Summing circuit 86 also receives an offset voltage from an offset 32. The value of the offset voltage from offset 32 is substantially equal to the offset voltage from offset 31. Summing circuit 86 subtracts the offset voltage of offset 32 from the input signal in order to cancel the offset voltage added to signal 97. Circuit 86 sums signal 97 with the FB signal and subtracts the offset voltage of offset 32 to form a compensated signal 87. Thus, the error signal deviations represented by signal 97 are cancelled from the FB signal. Amplifier 88 receives compensated signal 87 and responsively forms the compensated deviation signal that is used to form the error signals on nodes 42, 56, and 68.

Those skilled in the art will appreciate that it is the goal to form the compensation signal to be a constant value and preferably zero for the specified values of the averaged error signals. However, as is well known in the art there are always minor variances that prevent the signal from being identically constant or identically zero. It is well established in the art that variances of up to about ten percent (10%) are regarded as reasonable variances from the ideal goal of exactly zero or exactly equal. Also, those skilled in the art will understand that averaging circuit 95 can be any of a variety of well-known circuits that average together a plurality of signals such as a resistor network. Compensation generator 93 can be any of a variety of well-known circuits that pass signals that are between an upper and lower limit of the range of values of the signal. For example, generator 93 can be a clamp circuit that clamps a signal to a minimum and maximum value and that pass signal values that are between the minimum and maximum values.

Adjusting the error signal with compensation signal 97 allows controller 35 to more quickly recover and reinitiate providing output pulses as the value of the output voltage decreases or increases such as may occur when load 21 requires a lower value or higher value of current 20. Referring to FIG. 2 for example, the error signal is illustrated by plot 102 while a dashed plot 103 represents the value of the error signal without the use of compensation controller 92. Similarly, plot 107 illustrates the output voltage while a dashed plot 108 represents the value of the output voltage without the use of compensation controller 92. Suppose for example that at a time T1 current 20 decreases. As illustrated by plot 102, the error signal begins to decrease and the pulses of the switching control signal (plot 106) become narrower until the error voltage is substantially equal to Rmin as illustrated by plot 102 at a time T2. As the value of the error signal decreases below Rmin, compensation signal 97 decreases below the offset voltage, as illustrated by plot 104. Circuit 86 sums compensation signal 97 with the FB signal and subtracts the offset voltage of offset 32 to form compensated signal 87. Signal 87 is received by the error signal generator and minimizes the excursions of the value of the error signal as illustrated by the difference between plots 102 and 103 between times T2 and T3. The reduction in the error signal stops the switching control signal before the time that it would stop without controller 92 thereby minimizing overshoot in the output voltage. At time T3, the output voltage has decreased and the error signal has increased to Rmin as illustrated by plot 102. Since the error signal did not decrease and undershoot to a low value, controller 35 begins providing switching control signals to regulate the output voltage thereby minimizing undershoot in the output voltage. A portion of plot 106 is dashed to show the switching pulses that would not be provided without controller 92 and signal 97. The reduction in the undershoot of the output voltage is illustrated by the difference between plots 107 and 108 after time T3. Thus, controller 35 more quickly responds to the change in load current 20 and reduces overshoot and undershoot of the output voltage.

Without controller 92 and signal 97, the error signal would undershoot at time T2 which could result in overshoot of the output voltage. Extra time would be required to resume forming switching control pulses after time T3. As a result of the missing switching control pulses, the output voltage would undershoot and take longer to recover back to the desired value as illustrated by dashed plot 108 after time T3.

In order to facilitate this functionality for controller 35, regulator 80 is connected between input 36 and return 37. Feedback input 78 is connected to a first input of circuit 86. An output of circuit 86 is connected to a first terminal of impedance Z1 which has an output commonly connected to an inverting input of amplifier 88 and an input of impedance Z2. An output of reference 85 is connected to a non-inverting input of amplifier 88. An output of amplifier 88 is commonly connected to a second terminal of impedance Z2, a first input of circuit 67, a first input of circuit 55, and a first input of circuit 41. An output of circuit 41 is connected to node 42 and to a non-inverting input of comparator 43. An inverting input of comparator 43 is connected to a first output of ramp 83 to receive ramp R1. An output of comparator 43 is connected to an input of driver 44 which has an output connected to a gate of transistor 45. A drain of transistor 45 is connected to input 36 and a source is commonly connected to output 48 and a cathode of diode 47. An anode of diode 47 is connected to return 37. An inverting input of amplifier 46 is connected to input 49 and a non-inverting input is connected to input 50. An output of amplifier 46 is connected to a second input of circuit 41. An output of circuit 55 is connected to node 56 and to a non-inverting input of comparator 57. An inverting input of comparator 57 is connected to a second output of ramp 83 to receive ramp signal R2. An output of comparator 57 is connected to an input of driver 58 which has an output connected to a gate of transistor 59. A drain of transistor 59 is connected to input 36 and a source is commonly connected to output 62 and a cathode of diode 61. An anode of diode 61 is connected to return 37. An inverting input of amplifier 60 is connected to input 63 and a non-inverting input of amplifier 60 is connected to input 50. An output of amplifier 60 is connected to a second input circuit 55. An output of circuit 67 is connected to node 68 and to a non-inverting input of comparator 69. An inverting input of comparator 69 is connected to a third output of ramp 83 to receive ramp signal R3. An output of comparator 69 is connected to an input of driver 70 which has an output connected to a gate of transistor 71. A drain of transistor 71 is connected to input 36 and a source is commonly connected to output 74 and a cathode of diode 73. An anode of diode 73 is connected to return 37. An inverting input of amplifier 72 is connected to input 75 and a non-inverting input is connected to input 50. An output of amplifier 72 is connected to a second input of circuit 67. A first input of circuit 95 is connected to node 42, a second input of circuit 95 is connected to node 56, and a third input of circuit 95 is connected to node 68. An output of circuit 95 is commonly connected to an input of generator 93 and a non-inverting input of amplifier 96. A second input of generator 93 is connected receive a reference signal from ramp 83. An output of generator 93 is connected to an inverting input of amplifier 96. The output of amplifier 96 is connected to a second input of circuit 86.

Those skilled in the art will appreciate that signal 97 may be connected to the inverting input of amplifier 88 through another impedance that is substantially equal to Z1 instead of summing signal 97 into circuit 86. Additionally, in the embodiment illustrated in FIG. 1, amplifier 96 has unity gain, in other embodiments, amplifier 96 may have different gains and error signal 97 may be formed to be proportional to the difference between the averaged error signal and Rmin or Rpk.

Figure 3:
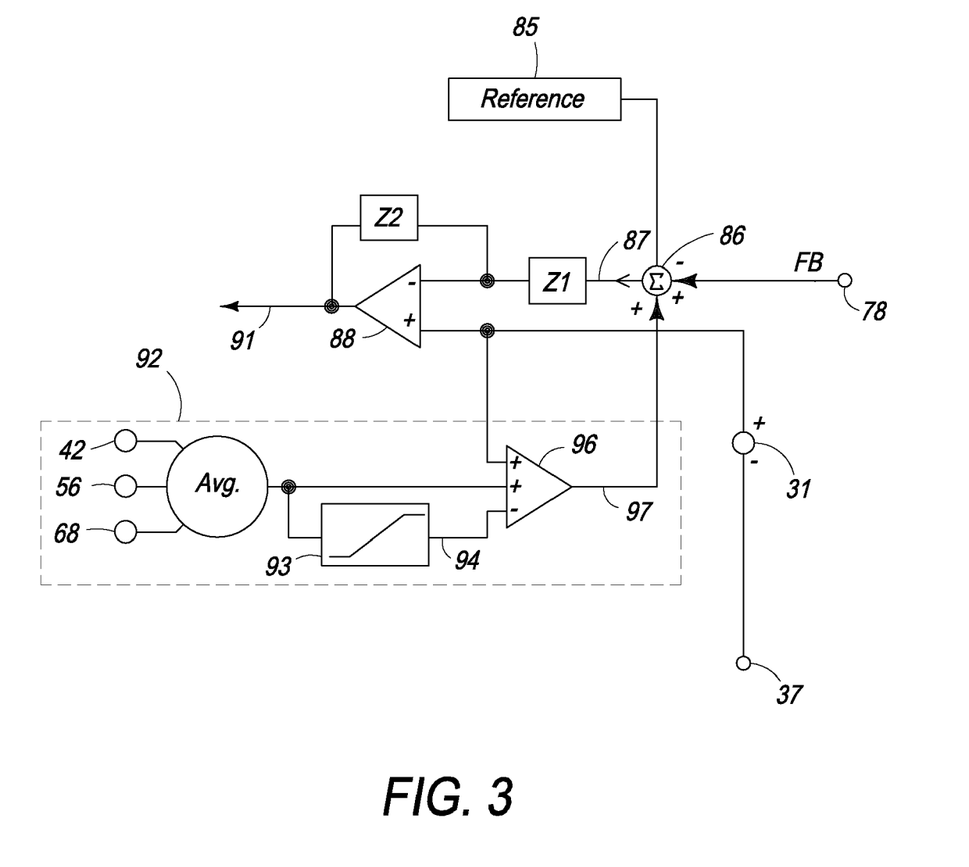
FIG. 3 schematically illustrates an embodiment of a portion of the multi-channel power supply controller of FIG. 1 in accordance with the present invention.

FIG. 3 schematically illustrates a portion of an embodiment of a configuration for controller 92, summing circuit 86, reference 85, offset 31, and amplifier 88 that facilitates forming compensated signal 87 and compensated deviation signal 91 that were described in the description of FIG. 1 and FIG. 2. Amplifiers 96 and 88 both receive the offset voltage from offset 31. Offset 32 is not used. Amplifier 96 has two non-inverting inputs and one inverting input. Amplifier 96 adds the offset voltage from offset 31 to the difference between the averaged error signal and signal 94 to form signal 97. Amplifier 88 also receives the offset voltage of offset 31 and subtracts it from the signal received from circuit 86 thereby canceling the offset voltage from compensated deviation signal 91. Summing circuit 86 sums compensation signal 97 and the FB signal together. Circuit 86 also receives the reference signal from reference 85 on an inverting input and subtracts the reference signal from the summed FB signal and signal 97.

Figure 4:
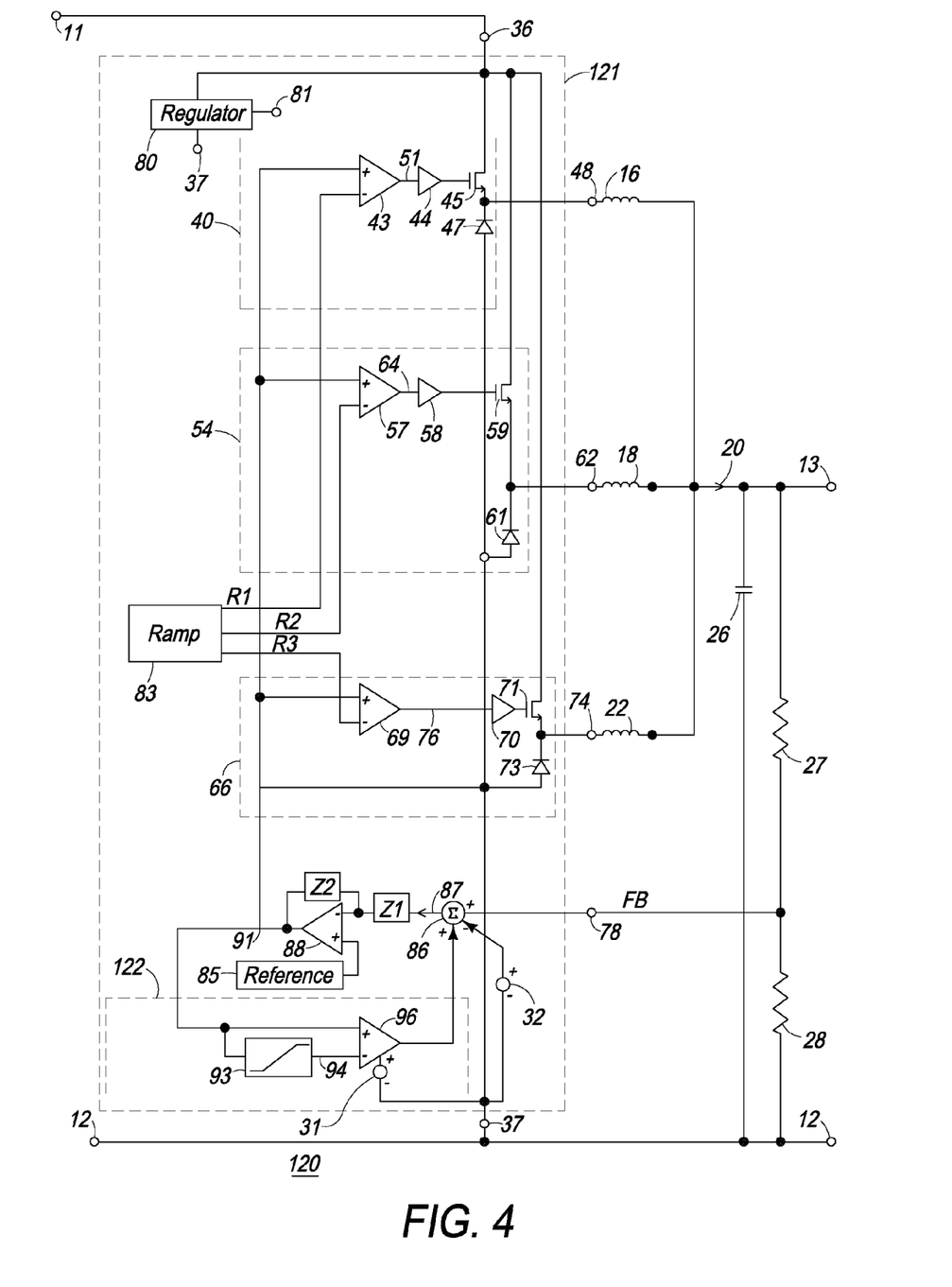
FIG. 4 schematically illustrates an embodiment of a portion of another multi-channel power supply system that includes another embodiment of a multi-channel power supply controller accordance with the present invention.

FIG. 4 schematically illustrates a portion of an embodiment of a multi-channel power supply control system 120 that includes an exemplary embodiment of a multi-channel power supply controller 121. System 120 is an alternate embodiment of system 10 and controller 121 is an alternate embodiment of controller 35 that was described in the description of FIG. 1 and FIG. 2. Controller 121 is similar to controller 35, however, controller 121 does not sense the current from each channel in order to control the value of the output voltage. Controller 121 utilizes the feedback (FB) signal to regulate the output voltage and not the value of the current from each channel that is used to form load current 20.

Controller 121 includes a compensation control circuit or compensation controller 122 that is an alternate embodiment of controller 92 (FIG. 1). Controller 122 is similar to controller 92 and functions in a similar manner except that controller 122 receives the output of amplifier 88 as the error signal instead of averaging together three error signals to provide an averaged error signal. Thus, controller 122 uses the error signal from amplifier 88. Also, each of channels 40, 54, and 66 utilize the error signal from amplifier 88 for the error signal of the respective comparators instead of summing together the signal from amplifier 88 and a current source signal.

Figure 5:
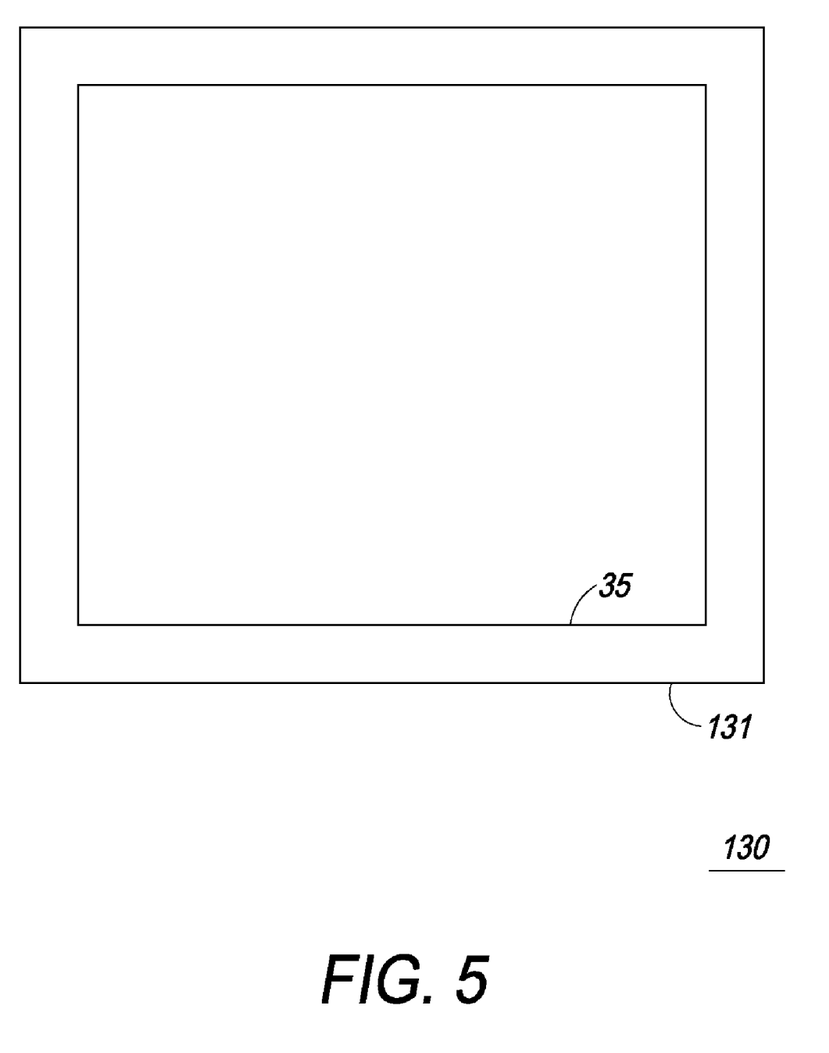
FIG. 5 illustrates an enlarged plan view of a semiconductor device that includes the multi-channel power supply controller of FIG. 1 in accordance with the present invention.

FIG. 5 schematically illustrates an enlarged plan view of a portion of an embodiment of a semiconductor device or integrated circuit 130 that is formed on a semiconductor die 131. Controller 35 is formed on die 131. Alternately, controller 121 may be formed on die 131. Die 131 may also include other circuits that are not shown in FIG. 5 for simplicity of the drawing. Controller 35 and device or integrated circuit 130 are formed on die 131 by semiconductor manufacturing techniques that are well known to those skilled in the art.

In view of all of the above, it is evident that a novel device and method is disclosed. Included, among other features, is configuring a switching power supply controller to use an error signal to control an output voltage. The switching power supply controller is also configured to form a compensation signal that is derived by using values of the error signal that are between an upper value and a lower value. The switching power supply controller is also configured to adjust a value of the error signal with the compensation signal. Adjusting the error signal minimizes overshoot and undershoot in the output voltage and improves the operation of the system that utilizes the switching power supply controller.

While the subject matter of the invention is described with specific preferred embodiments, it is evident that many alternatives and variations will be apparent to those skilled in the semiconductor arts. For example, controllers 35 and 121 are illustrated to have three channels, but the invention is also applicable to a single channel or multiple channels. Additionally the Rpk and Rmin values of the ramp signals used to form compensation signal 94 may be replaced by other values of the ramp signal. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A power supply controller comprising:
a switching control circuit coupled to receive an error signal and a ramp signal and responsively form a switching control signal to regulate an output voltage;
a compensation control circuit configured to receive the error signal and form a compensation control signal that is substantially the same as the error signal for values of the error signal that are between a first value and a second value and that limits the compensation control signal to the first value when the error signal is no less than the first value and limits the compensation control signal to the second value when the error signal is no greater than the second value, the compensation control circuit configured to form a compensation signal that is substantially constant for values of the error signal that are between the first value and the second value and that has variations that are substantially equal to a difference between the error signal and the first value for values of the error signal that are no less than the first value and that has variations that are substantially equal to a difference between the error signal and the second value for values of the error signal that are no greater than the second value;
a first summing circuit configured to sum the compensation signal with a feedback signal that is representative of the output voltage and form a compensated signal; and
an error signal generator configured to receive the compensated signal wherein the power supply controller uses the compensated signal to form the error signal.

2. The power supply controller of claim 1 wherein the first value is substantially equal to a first ramp signal value of the ramp signal and the second value is substantially equal to a second ramp signal value of the ramp signal.

3. The power supply controller of claim 1 wherein the first value is substantially equal to a peak value of the ramp signal and the second value is substantially equal to a minimum value of the ramp signal.

4. The power supply controller of claim 1 wherein the compensation control circuit sums the compensation control signal with the error signal to form the compensated signal.

5. The power supply controller of claim 1 wherein the power supply controller includes a plurality of channels and a plurality of ramp signals and wherein each channel receives a ramp signal of the plurality of ramp signals, forms the error signal for the channel and forms a switching control signal for the channel; and wherein the compensation control circuit is configured to average each error signal from the plurality of channels and to use the average to form the compensated signal.

6. A power supply controller comprising:
a plurality of channels and a plurality of ramp signals wherein each channel receives a ramp signal of the plurality of ramp signals, forms the error signal for the channel and forms a switching control signal for the channel;
a compensation control circuit configured to average each error signal from the plurality of channels and to use the average to form a compensation control signal that is substantially the same as the error signal for values of the error signal that are between a first value and a second value and that limits the compensation control signal to the first value when the error signal is no less than the first value and limits the compensation control signal to the second value when the error signal is no greater than the second value, the compensation control circuit configured to form the compensated signal that is substantially constant for values of the average of the error signals that is between the first value and the second value and that has variations that are substantially equal to a difference between the average of the error signals and the first value for values of the average of the error signals that are no less than the first value and that has variations that are substantially equal to a difference between the average of the error signals and the second value for values of the average of the error signals that is no greater than the second value;
a first summing circuit configured to sum the compensation signal with a feedback signal that is representative of the output voltage and form a compensated signal; and
an error signal generator configured to receive the compensated signal wherein the power supply controller uses the compensated signal to form the error signal.

7. The power supply controller of claim 5 wherein each ramp signal of the plurality of ramp signal has substantially equal peak and minimum values and wherein the first value is substantially equal to a first ramp signal value of the plurality of ramp signals and the second value is substantially equal to a second ramp signal value of the plurality of ramp signals.

8. The power supply controller of claim 7 wherein the first value is substantially equal to the peak value of the ramp signals and the second value is substantially equal to the minimum value of the ramp signals.

9. The power supply controller of claim 5 wherein the error signal generator includes an error amplifier coupled to receive the compensated signal from the first summing circuit, and a plurality of secondary summing circuit with each secondary summing circuit coupled to receive an output of the error amplifier, to receive a current sense signal, and responsively form the error signal for the channel.

10. The power supply controller of claim 1 wherein the compensation control circuit includes a compensation generator that forms the compensation control signal and an amplifier that receives the compensation control signal and the error signal.

11. A method of forming a power supply controller comprising:

configuring the power supply controller to receive a feedback signal that is representative of an output voltage controlled by the power supply controller;
configuring an error signal generator circuit to use the feedback signal to form an error signal;
configuring the power supply controller to form a compensation signal that is substantially constant for values of the error signal that are between a first value and a second value, that has variations that are substantially equal to a difference between the error signal and the first value for error signal values that are substantially no less than the first value, and that has variations that are substantially equal to a difference between the error signal and the second value for error signal values that are substantially no greater than the second value; and
configuring the power supply controller to use the compensation signal to adjust the error signal.

12. The method of claim 11 wherein configuring the power supply controller to use the compensation signal to adjust the error signal includes configuring the power supply controller to sum the compensation signal with the feedback signal and coupling an error amplifier to receive a result thereof.

13. The method of claim 11 wherein configuring the power supply controller to form the compensation signal includes configuring a compensation control circuit to receive the error signal, use the error signal to form a compensation control signal that is substantially equal to the error signal for values of the error signal that are between the first value and the second value, and subtract the compensation control signal from the error signal to form the compensation signal.

14. The method of claim 13 including configuring a compensation generator to receive the error signal and to limit a maximum value of an output of the compensation generator to the first value and to limit a minimum value of the output to the second value.

15. A method of forming a power supply controller comprising:
configuring the power supply controller to receive a feedback signal that is representative of an output voltage controlled by the power supply controller;
configuring an error signal generator circuit to use the feedback signal to form an error signal; and
configuring the power supply controller to use substantially the error signal in controlling the output voltage for values of the error signal that are between a first value and a second value, to compensate the error signal with a signal that is representative of a difference between the error signal and the first value for values of the error signal that are no less than the first value, and to compensate the error signal with a signal that is representative of a difference between the error signal and the second value for values of the error signal that are no greater than the second value.

16. The method of claim 15 wherein configuring the power supply controller to use substantially the error signal in controlling the output voltage for values of the error signal that are between the first value and the second value includes configuring an error amplifier to use substantially an uncompensated value of the feedback signal to cause the power supply controller to form the error signal.

17. The method of claim 15 wherein configuring the power supply controller to use substantially the error signal in controlling the output voltage for values of the error signal that are between the first value and the second value, to compensate the error signal with a signal that is representative of a difference between the error signal and the first value for values of the error signal that are no less than the first value includes configuring an error amplifier to use the signal that is representative of the difference between the error signal and the first value to cause the power supply controller to form the error signal.

18. The method of claim 17 further including configuring the power supply controller to sum the signal with the feedback signal and responsively use the sum to form the error signal.

19. The method of claim 15 wherein configuring the power supply controller to use substantially the error signal in controlling the output voltage for values of the error signal that are between the first value and the second value, to compensate the error signal with a signal that is representative of a difference between the error signal and the first value for values of the error signal that are no less than the first value, and to compensate the error signal with a signal that is representative of a difference between the error signal and the second value for values of the error signal that are no greater than the second value includes configuring an error amplifier to use the signal that is representative of the difference between the error signal and the second value to cause the power supply controller to form the error signal.

20. The method of claim 19 further including coupling the error amplifier to receive a summation of feedback signal and the signal to form an intermediate signal and to sum the intermediate signal with a current sense signal that is representative of a load current supplied by the power supply controller.

* * * * *